US009668338B2

(12) United States Patent
Uno et al.

(10) Patent No.: US 9,668,338 B2
(45) Date of Patent: May 30, 2017

(54) SEMICONDUCTOR DEVICE

(71) Applicant: Panasonic Intellectual Property Management Co., Ltd., Osaka (JP)

(72) Inventors: Takashi Uno, Hyogo (JP); Kazuhiro Yahata, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 188 days.

(21) Appl. No.: 14/404,102

(22) PCT Filed: Feb. 28, 2014

(86) PCT No.: PCT/JP2014/001105
§ 371 (c)(1),
(2) Date: Nov. 26, 2014

(87) PCT Pub. No.: WO2014/155974
PCT Pub. Date: Oct. 2, 2014

(65) Prior Publication Data
US 2015/0216035 A1    Jul. 30, 2015

(30) Foreign Application Priority Data
Mar. 27, 2013   (JP) ................................ 2013-066885

(51) Int. Cl.
*H05K 1/18*    (2006.01)
*H05K 1/02*    (2006.01)
(Continued)

(52) U.S. Cl.
CPC ........... *H05K 1/0237* (2013.01); *H01L 23/66* (2013.01); *H05K 1/18* (2013.01); *H01L 23/043* (2013.01);
(Continued)

(58) Field of Classification Search
CPC .......... H05K 2201/10689; H05K 2201/10166; H01L 2225/06548; H01L 23/043
(Continued)

(56) References Cited

U.S. PATENT DOCUMENTS 8,754,519 B2 *   6/2014   Hasegawa ............. H01L 23/047
257/678

FOREIGN PATENT DOCUMENTS

JP   61-224344   10/1986
JP   3-185751    8/1991
(Continued)

OTHER PUBLICATIONS

English Translation of the International Preliminary Report on Patentability and Written Opinion of the International Searching Authority issued Sep. 29, 2015 in International (PCT) Application No. PCT/JP2014/001105.
(Continued)

*Primary Examiner* — Binh Tran
(74) *Attorney, Agent, or Firm* — Wenderoth, Lind & Ponack, L.L.P.

(57) ABSTRACT

A semiconductor device is provided that is inexpensively manufactured with variation in high-frequency characteristics suppressed. Internal matching circuit boards are disposed on at least one signal transmission path of an input-side signal transmission path between an input terminal and a semiconductor element and an output-side signal transmission path between the semiconductor element and an output terminal and is provided for matching at least between output impedance of an external circuit connected to the input terminal and input impedance of the semiconductor device or between input impedance of an external circuit connected to the output terminal and output impedance of the semiconductor device, and components are
(Continued)

electrically connected by at least one wire causing a change exceeding an allowable value in high-frequency characteristics of the semiconductor device due to a change in wire length and are disposed in contact with each other inside a package.

2 Claims, 10 Drawing Sheets

(51) Int. Cl.
      *H01L 23/66*     (2006.01)
      *H05K 7/00*     (2006.01)
      *H01L 23/02*     (2006.01)
      *H01L 23/48*     (2006.01)
      *H01L 23/52*     (2006.01)
      *H01L 23/043*     (2006.01)
      *H01L 23/047*     (2006.01)

(52) U.S. Cl.
    CPC ..... *H01L 23/047* (2013.01); *H01L 2223/6611* (2013.01); *H01L 2223/6655* (2013.01); *H01L 2224/45144* (2013.01); *H01L 2224/48091* (2013.01); *H01L 2224/48137* (2013.01); *H01L 2224/48139* (2013.01); *H01L 2224/49175* (2013.01); *H01L 2225/06548* (2013.01); *H01L 2924/3011* (2013.01); *H01L 2924/30111* (2013.01); *H05K 2201/10166* (2013.01); *H05K 2201/10689* (2013.01)

(58) Field of Classification Search
    USPC ........ 361/764, 783; 257/678, 690, 692, 693, 257/713
    See application file for complete search history.

(56) References Cited

FOREIGN PATENT DOCUMENTS

| JP | 6-275736 | 9/1994 |
|---|---|---|
| JP | 7-74517 | 3/1995 |
| JP | 2001-230640 | 8/2001 |
| JP | 2001230640 A * | 8/2001 |

OTHER PUBLICATIONS

International Search Report issued May 20, 2014 in International (PCT) Application No. PCT/JP2014/001105.

* cited by examiner

SEMICONDUCTOR DEVICE

TECHNICAL FIELD

This disclosure relates to a semiconductor device provided with a semiconductor element and, more particularly, to a semiconductor device having a semiconductor element processing high-frequency signals and a matching circuit.

BACKGROUND ART

Input/output impedance of a semiconductor element processing a high-frequency signal is generally different from input/output impedance of an external circuit to be connected to the semiconductor element. For example, if an external circuit with an input/output impedance value of 50Ω (Ohm) is connected to a semiconductor element having an input/output impedance value different from 50Ω, mismatching of impedance occurs between the semiconductor element and the external circuit. Therefore, a semiconductor device includes a matching circuit for eliminating the mismatching of impedance with the external circuit (hereinafter simply referred to as a "matching circuit"), which is disposed on the input side and the output side of the semiconductor device for high frequency.

Particularly, when the semiconductor element is a transistor chip having high input and output electric power, a gate width of the transistor chip is large while the impedance of the transistor chip is very low and, therefore, the mismatching of impedance with the external circuit becomes larger. Since a semiconductor device including such a transistor chip has a matching circuit loss made larger depending on a circuit configuration, a component with a high Q-value is used for making up a matching circuit while the matching circuit is disposed within a package so as to reduce the matching circuit loss in a mainstream technique.

An internal matching circuit disposed within a packaged semiconductor device has a high permittivity board expected to produce a wavelength shortening effect, a conductor layer having a conductor pattern formed on a surface of the high permittivity board, and a grounding conductor layer formed on the entire back surface of the high permittivity board, and the internal matching circuit is provided with a capacitance pattern or a microstrip line pattern.

A wire such as a gold wire is used for connecting the transistor chip and the internal matching circuit as well as a lead terminal for connection to an external circuit outside a package and the internal matching circuit. When a high-frequency signal is applied to this wire, the inductance of the wire is not negligible and the inductance of the wire acts as a portion of the internal matching circuit. Therefore, if the length of the wire changes because of displacement of each of the transistor chip and the internal matching circuit or dimension tolerances of the transistor chip and the internal matching circuit, variation occurs in the high-frequency characteristics of the semiconductor device, for example, high-frequency characteristics such as a loss due to mismatching of impedance at a connection point between the external circuit and the semiconductor device and/or a transmission loss in a signal transmission path from the lead terminal to the transistor chip.

To reduce the variation in the high-frequency characteristics as described above, in a method disclosed in Patent Literature 1, grooves are formed in advance on a mounting surface on which a transistor chip and a matching circuit board are mounted, and the transistor chip and the matching circuit board are positioned by using the grooves.

In a method disclosed in Patent Literature 2, a concave portion is formed on a mounting surface on which a circuit board is mounted, and the circuit board is embedded in the concave portion.

In a configuration disclosed in Patent Literature 3, a semiconductor device has a semiconductor element disposed on a convex-shaped pedestal formed on a surface of a carrier plate and has a matching circuit board mounted on the surface of the carrier plate in the vicinity of the pedestal. The pedestal has an inverted trapezoidal cross section (has overhanging side surfaces). This configuration prevents the matching circuit board from partially lying on the pedestal when being mounted on the carrier plate as compared to the case of the pedestal having a trapezoidal cross section.

CITATION LIST

Patent Literature

PLT 1: Japanese Laid-Open Patent Publication No. H 6-275736
PLT 2: Japanese Laid-Open Patent Publication No. S 61-224344
PLT3: Japanese Laid-Open Patent Publication No. H 3-185751

SUMMARY OF INVENTION

Technical Problem

The methods of Patent Literatures 1 to 3, however, require special additional processing of forming reference portions for positioning, such as grooves or concave portions, to a mounting surface on which a transistor chip and a matching circuit board are mounted. Since the transistor chip and the matching circuit board are positioned based on the reference portions formed by such additional processing, high processing accuracy is obviously required for the additional processing for forming the reference portions.

Additionally, if the reference portions such as grooves or concave portions are additionally processed on the mounting surface for the transistor chip and the matching circuit board, a portion of the mounting surface around the processed portion may be distorted and the flatness may be reduced in a portion of the mounting surface on which the transistor chip and the matching circuit board are mounted. As a result, this may reduce the positioning accuracy of the transistor chip and the matching circuit board to the mounting surface.

Therefore, if the additional processing is performed on the mounting surface such that the transistor chip and the matching circuit board can highly accurately be positioned and mounted on the mounting surface, the processing cost inevitably increases. As a result, there will be a problem that the semiconductor device becomes expensive.

Therefore, a task in an aspect of this disclosure is to provide a semiconductor device which can be manufactured at a low cost, and can suppress the variation in high-frequency characteristics.

Solution to Problem

To attain the task described above, an aspect of this disclosure provides a semiconductor device having a package comprising:
as components disposed inside the package,
an input terminal and an output terminal for exchanging signals with an external circuit outside the package;

a semiconductor element disposed on a signal transmission path between the input terminal and the output terminal to execute a signal process;

an internal matching circuit board disposed on at least one signal transmission path of an input-side signal transmission path between the input terminal and the semiconductor element and an output-side signal transmission path between the semiconductor element and the output terminal for matching at least between output impedance of an external circuit connected to the input terminal and input impedance of the semiconductor device or between input impedance of an external circuit connected to the output terminal and output impedance of the semiconductor device; and a plurality of wires electrically connecting components to transmit signals, the semiconductor device including components electrically connected by at least one wire causing a change exceeding an allowable value in high-frequency characteristics of the semiconductor device due to a change in wire length out of the plurality of the wires, the components being disposed in direct or indirect contact with each other inside the package.

Advantageous Effects of Invention

According to an aspect of this disclosure, when components are electrically connected by at least one wire causing a change exceeding an allowable value in high-frequency characteristics of the semiconductor device due to a change in wire length, the components can be brought into contact with each other to suppress variation in wire length of wires in the semiconductor device. As a result, the semiconductor device can inexpensively be manufactured to provide the semiconductor device having excellent characteristics with variations in high-frequency characteristics suppressed.

DESCRIPTION OF EMBODIMENTS

Figure 1:
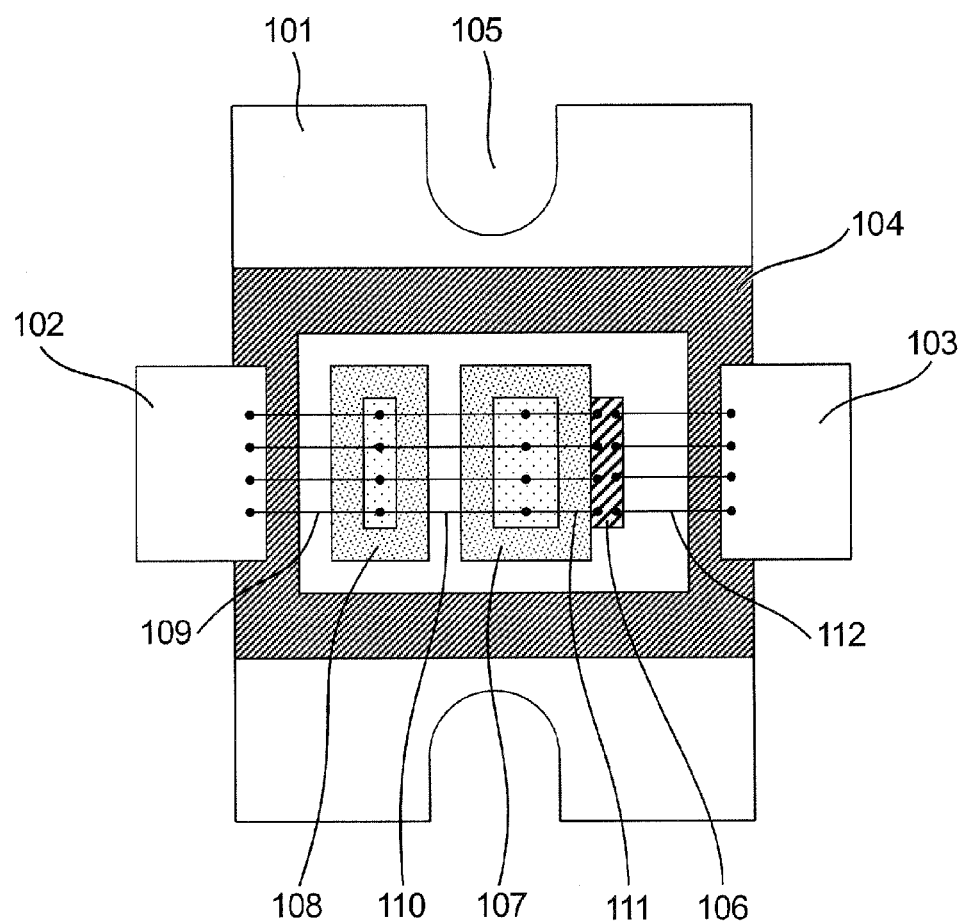
FIG. 1 is a top view of a semiconductor device of a first embodiment in this disclosure.

A semiconductor device of a first aspect according to this disclosure is a semiconductor device having a package comprising:

as components disposed inside the package, an input terminal and an output terminal for exchanging signals with an external circuit outside the package;

a semiconductor element disposed on a signal transmission path between the input terminal and the output terminal to execute a signal process;

an internal matching circuit board disposed on at least one signal transmission path of an input-side signal transmission path between the input terminal and the semiconductor element and an output-side signal transmission path between the semiconductor element and the output terminal for matching at least between output impedance of an external circuit connected to the input terminal and input impedance of the semiconductor device or between input impedance of an external circuit connected to the output terminal and output impedance of the semiconductor device; and a plurality of wires electrically connecting components to transmit signals, the semiconductor device including components electrically connected by at least one wire causing a change exceeding an allowable value in high-frequency characteristics of the semiconductor device due to a change in wire length out of the plurality of the wires, the components being disposed in direct or indirect contact with each other inside the package.

The semiconductor device of the first aspect configured as described above can be manufactured at a lower cost and can suppress variation in high-frequency characteristics.

A semiconductor device of a second aspect according to this disclosure is configured that, in the semiconductor device of the first aspect, impedance of the semiconductor element having a reactance component equal to or less than zero is converted by inductance of the wires and a matching circuit of the internal matching circuit board, and matched with the output impedance of the external circuit connected to the input terminal or the input impedance of the external circuit connected to the output terminal, and out of the wires converting impedance of the semiconductor element having a reactance component equal to or less than zero into inductive impedance, components electrically connected by the wire closest to the semiconductor element may be disposed in direct or indirect contact with each other inside the package.

A semiconductor device of a third aspect according to this disclosure is configured that, in the semiconductor device of the first aspect, impedance of the semiconductor element having a reactance component equal to or less than zero is converted by inductance of the wires and matching circuits of the internal matching circuit boards, and matched with the output impedance of the external circuit connected to the input terminal or the input impedance of the external circuit connected to the output terminal, and out of the internal matching circuit boards converting impedance of the semiconductor element having a reactance component equal to or less than zero into inductive impedance, components electrically connected by a wire immediately after conversion into the inductive impedance by the internal matching circuit board closest to the semiconductor element may be disposed in direct or indirect contact with each other inside the package.

In a semiconductor device of a fourth aspect according to this disclosure, the internal matching circuit board in the first aspect includes an input-side internal matching circuit board disposed on the input-side signal transmission path between the input terminal and the semiconductor element for matching impedance on the input side, and an output-side matching circuit board disposed on the output-side signal transmission path between the semiconductor element and the output terminal for matching impedance on the output side, and the semiconductor element and the input-side internal matching circuit board may be disposed in direct or indirect contact inside the package while the output-side internal matching circuit board and the output terminal may be disposed in direct or indirect contact inside the package.

In a semiconductor device of a fifth aspect according to this disclosure, components are electrically connected by at least one wire other than the wire having a characteristic causing a change exceeding an allowable value in high-frequency characteristics of the semiconductor device due to a change in wire length out of the plurality of the wires in the first aspect, and may be disposed at a distance from each other inside the package.

In a semiconductor device of a sixth aspect according to this disclosure, in any aspect of the first to five viewpoints, a transistor chip is included as the semiconductor element, and a gate of the transistor chip may be on the input terminal side while a drain of the transistor chip may be on the output terminal side.

In a semiconductor device of a seventh aspect according to this disclosure, in any aspect of the first to sixth viewpoints, an index of the high-frequency characteristics of the semiconductor device may be a mismatch loss of impedance at an input end or an output end of the input terminal or at an input end, or an output end of the output terminal.

In a semiconductor device of an eighth aspect according to this disclosure, in any aspect of the first to sixth viewpoints, an index of the high-frequency characteristics of the semiconductor device may be a transmission loss of a signal transmission path between the input terminal and the semiconductor element or between the semiconductor element and the output terminal.

In a semiconductor device of a ninth aspect according to this disclosure, in any aspect of the first to sixth aspects, an index of the high-frequency characteristics of the semiconductor device may be a power gain from the input terminal to the output terminal.

A semiconductor device having a transistor chip as a semiconductor element in a package will now be described as an embodiment of the semiconductor device of this disclosure with reference to the accompanying drawings. The semiconductor device of this disclosure is not limited to the configuration of the semiconductor device described in the following embodiment and includes an apparatus configured based on a technical concept equivalent to a technical concept described in the following embodiment.

First Embodiment

A semiconductor device of a first embodiment according to this disclosure will hereinafter be described with reference to the accompanying drawings.

Figure 2:
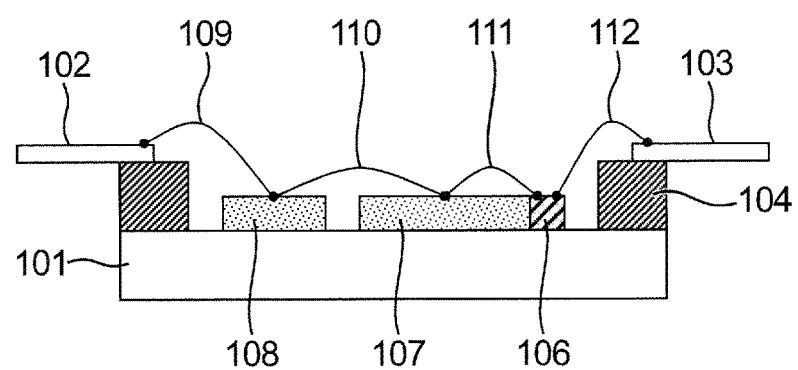
FIG. 2 is a cross-sectional view of the semiconductor device of the first embodiment in this disclosure.

FIG. 1 is a top view of the semiconductor device of the first embodiment. FIG. 2 is a cross-sectional view of the semiconductor device shown in FIG. 1.

As shown in FIGS. 1 and 2, the semiconductor device of the first embodiment has a base portion 101 on which components are mounted, a ceramic frame body 104 disposed on the base portion 101 to clearly limit a region of mounting of the components on the base portion 101, and an input terminal 102 and an output terminal 103 disposed on the ceramic frame body 104. In a package of the semiconductor device made up of the base portion 101, the ceramic frame body 104, the input terminal 102, and the output terminal 103, i.e., in a region surrounded by the ceramic frame body 104 on the base portion 101, a transistor chip 106 acting as a semiconductor element, a first internal matching circuit board 107, and a second internal matching circuit board 108 are mounted as components disposed inside the package. In the semiconductor device of the first embodiment, the first internal matching circuit board 107 and the second internal matching circuit board 108 are input-side internal matching circuit boards disposed between the input terminal 102 and the transistor chip 106.

The base portion 101 includes cutouts 105 having a portion cut into an arc shape and is screwed through these cutouts 105 to another member to mount the semiconductor device as a module.

The input terminal 102 and the output terminal 103 are terminals for exchanging signals with an external circuit (not shown) outside the package and electrically connect the external circuit and the components inside the package.

The transistor chip 106 is made up of, for example, a semiconductor chip using a semiconductor such as Si-LDMOS or GaAs and GaN for amplifying a high-frequency signal. The transistor chip 106 is disposed on a signal transmission path between the input terminal 102 and the output terminal 103. The transistor chip 106 in the first embodiment has a back surface disposed on the base portion 101 and joined with a fixing means such as paste or solder, for example. A source terminal of the transistor chip 106 is electrically connected to the base portion 101 through a conductor layer, a through-via, or a wire formed on the back surface, for example.

The first and second internal matching circuit boards 107, 108 are made up by forming patterns of conductor layers on a surface and a back surface of a high permittivity ceramic board made of alumina or titanium oxide, for example.

In the semiconductor device of the first embodiment, the first and second internal matching circuit boards 107, 108 are disposed on an input-side signal transmission path between the input terminal 102 and the transistor chip 106 for matching the input impedance of the transistor chip 106 and the output impedance of the external circuit connected to the input terminal 102. On the input-side signal transmission path between the input terminal 102 and the transistor chip 106, the first internal matching circuit board 107 is disposed closer to the transistor chip 106 while the second internal matching circuit board 108 is disposed closer to the input terminal 102. The first and second internal matching circuit boards 107, 108 have the respective back surfaces joined to the base portion 101 through conductive paste or solder, for example. Therefore, the conductor layers formed on the respective back surfaces of the first and second internal matching circuit boards 107, 108 are electrically connected to the base portion 101.

As shown in FIG. 1, the input terminal 102 is electrically connected to the conductor layer pattern on the surface of the second internal matching circuit board 108 through a plurality of first wires 109 such as gold wires.

The conductor layer pattern on the surface of the first internal matching circuit board 107 is electrically connected to the conductor layer pattern on the surface of the second internal matching circuit board 108 through a plurality of second wires 110.

The conductor layer pattern on the surface of the first internal matching circuit board 107 is electrically connected to a gate terminal of the transistor chip 106 through a plurality of third wires 111.

A drain terminal of the transistor chip 106 is electrically connected to the output terminal 103 through a plurality of fourth wires 112.

As shown in FIG. 1, the semiconductor device of the first embodiment has components, i.e., the first internal matching circuit board 107 and the transistor chip 106, mounted in direct contact with each other on the base portion 101.

The respective contact surfaces of the first internal matching circuit board 107 and the transistor chip 106 are outside surfaces of the respective components and are at predetermined positions set in advance on the respective outside surfaces. In the configuration of the first embodiment, the contact surfaces of the respective components are surfaces intersecting with lines that are straight lines linking the connection points of the conductor layer pattern of the first internal matching circuit board 107 and the gate terminal of the transistor chip 106 connected through the third wires 111 when viewed from above.

Description will hereinafter be made of the reason why the semiconductor device is configured such that the first internal matching circuit board 107 and the transistor chip 106 connected through the third wires 111 are brought into direct contact in the semiconductor device of the first embodiment. In the following description, it is assumed that the impedance of the external circuit connected to the input terminal 102 of the semiconductor device is 50Ω.

Figure 3:
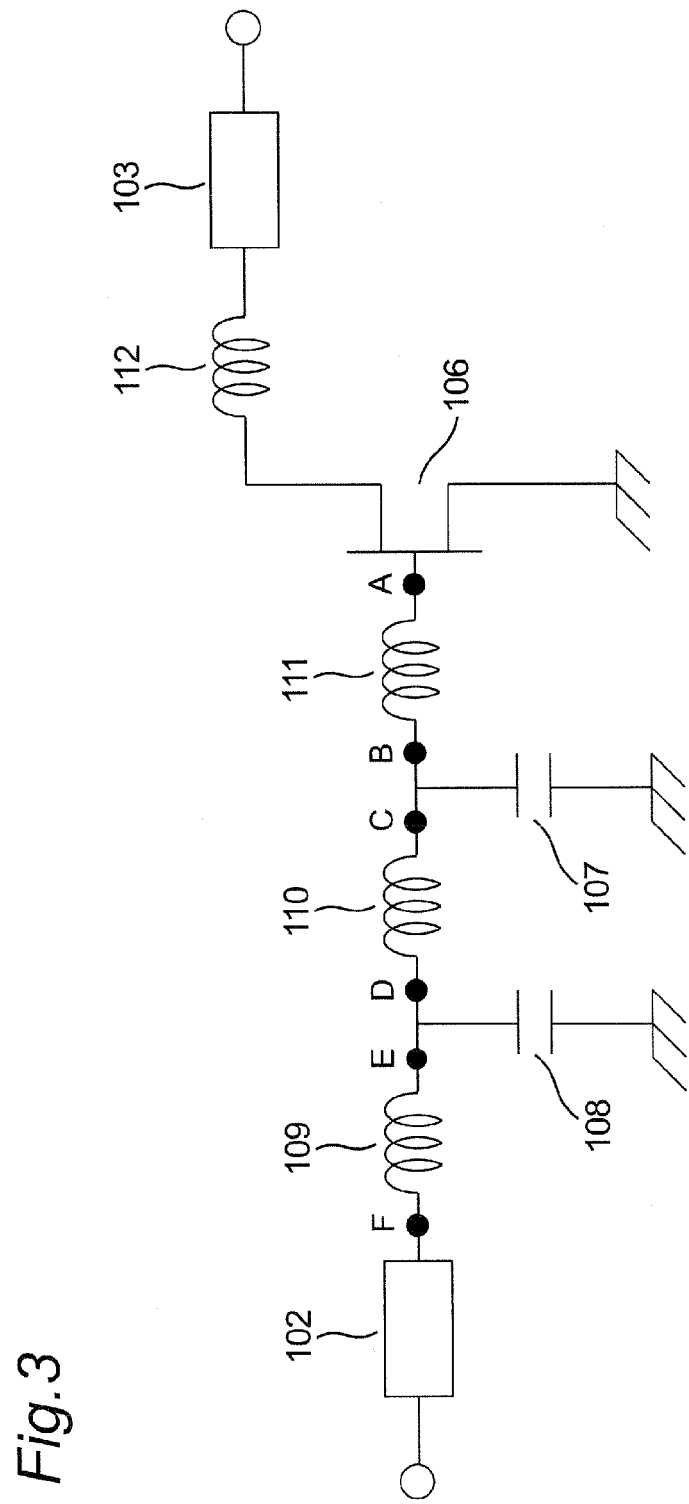
FIG. 3 is an equivalent circuit diagram of the semiconductor device of the first embodiment in this disclosure.

FIG. 3 shows an equivalent circuit of the semiconductor device of the first embodiment shown in FIGS. 1 and 2. The elements of FIG. 3 are denoted by the numbers of the constituent elements of the semiconductor device of the first embodiment shown in FIGS. 1 and 2.

The first and second internal matching circuit boards 107, 108 are made up by forming the patterns of the conductor layers on the surface and the back surface of the high permittivity board as described above and, therefore, act as parallel plate type capacitance elements. Since the base portion 101 is electrically connected to the conductor layers on the back surfaces of the first and second internal matching circuit boards 107, 108 and is grounded, the first and second internal matching circuit boards 107, 108 are parallel-plate capacitors and can be considered as capacitance elements connected in parallel as shown in FIG. 3.

Since the first to fourth wires 109 to 112 transmit high-frequency signals (high-frequency electric power), inductance components of the wires 109 to 112 are not negligible. Therefore, as shown in the equivalent circuit of FIG. 3, the first to fourth wires 109 to 112 are considered as inductances.

The input terminal 102 and the output terminal 103 can be considered as a microstrip line on the ceramic frame body 104 since the base portion 101 is grounded.

Figure 4:
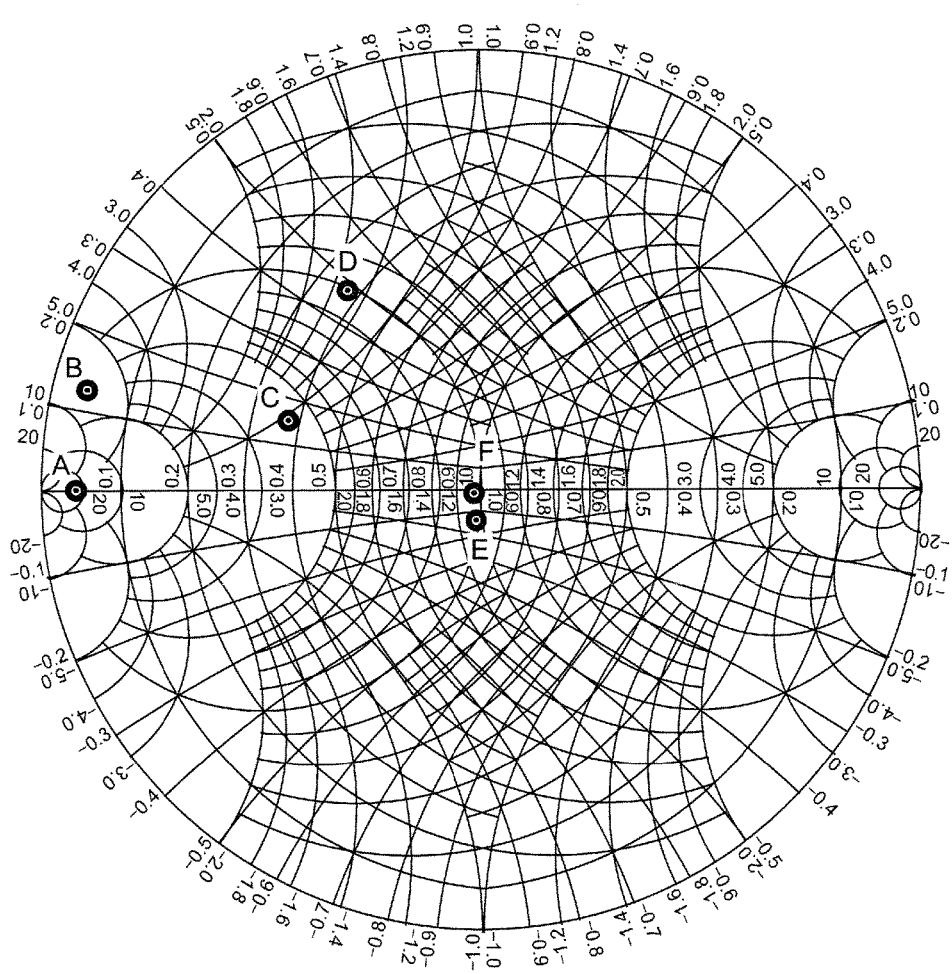
FIG. 4 is an explanatory diagram of input impedance of the semiconductor device of the first embodiment in this disclosure.

FIG. 4 shows impedance on a Smith chart when the transistor chip 106 is viewed at connection points A to F between the multiple components shown in the equivalent circuit of FIG. 3. By way of example, FIG. 4 shows the case of the transistor chip 106 having the input impedance of (2.000+j0)Ω and the signal frequency of 2 GHz. Therefore, a reactance component in the impedance of the transistor chip 106 is equal to or less than zero.

When the transistor chip 106 is viewed from the connection point A between the transistor chip 106 and the third wires 111, the impedance is the same as the input impedance of the transistor chip 106 and is therefore (2.000+j0)Ω indicated by a point A in FIG. 4.

By way of example, if the inductance value of the third wires 111 is 0.5 nH, when the transistor chip 106 is viewed from the connection point B between the third wires 111 and a matching circuit of the first internal matching circuit board 107, the impedance is (2.000+j6.283)Ω indicated by a point B of FIG. 4.

By way of example, if the capacitance value of the first internal matching circuit board 107 is 10 pF, when the transistor chip 106 is viewed from the connection point C between the matching circuit of the first internal matching circuit board 107 and the second wires 110, the impedance is (18.614+j7.627)Ω indicated by a point C of FIG. 4.

By way of example, if the inductance value of the second wires 110 is 1.3 nH, when the transistor chip 106 is viewed from the connection point D between the second wires 110 and a matching circuit of the second internal matching circuit board 108, the impedance is (18.614+j23.964)Ω indicated by a point D of FIG. 4.

By way of example, if the capacitance value of the second internal matching circuit board 108 is 2.3 pF, when the transistor chip 106 is viewed from the connection point E between the matching circuit of the second internal matching circuit board 108 and the first wires 109, the impedance is (48.484−j6.897)Ω indicated by a point E of FIG. 4.

By way of example, if the inductance value of the first wires 109 is 0.5 nH, when the transistor chip 106 is viewed from the connection point F between the first wires 109 and the input terminal 102, the impedance is (48.484−j0.614)Ω, i.e., about 50)Ω, indicated by a point F of FIG. 4. Since 50Ω is substantially equivalent to the impedance of the external circuit connected to the input terminal 102 of the semiconductor device in this exemplification, the impedance matching can be achieved between the semiconductor device and the external circuit.

The inductance values of the wires can be adjusted by changing the length of the wires, the number of the wires, and the distance between the wires.

The respective capacitance values of the first and second internal matching circuit boards 107, 108 can be adjusted by changing the relative permittivity of the high permittivity board, the thickness of the high permittivity board, and the areas of the conductor layers formed on the surface and the back surface thereof.

Figure 5:
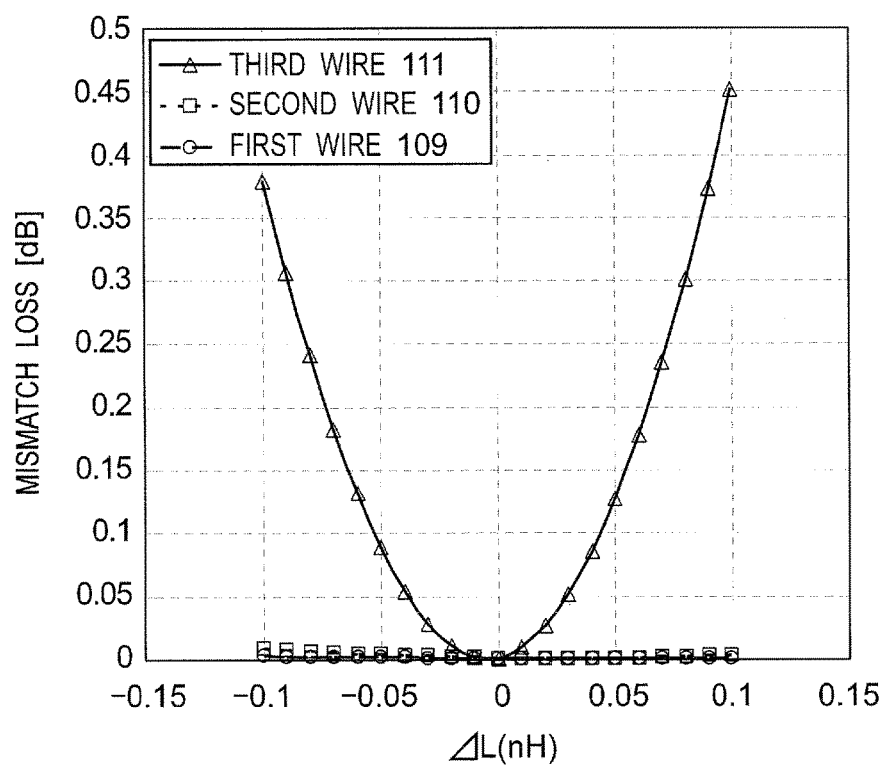
FIG. 5 is a diagram of relationship between change in inductance value of wires and mismatch loss of impedance of the first embodiment in this disclosure.

FIG. 5 shows a mismatch loss of the impedance at the connection point F when an inductance value of any one of the first wires 109, the second wires 110, and the third wires 111 changes relative to a design value. In FIG. 5, the horizontal axis indicates a change in the inductance value of the wires 109 to 111 and the vertical axis indicates a mismatch loss of the impedance at the connection point F. In the case shown in FIG. 5, the inductance value of the wires 109 to 111 changes within a range of ±0.1 nH relative to the design value.

The design value in this case is an inductance value of the wires designed (calculated) such that matching can be achieved between the input impedance of the transistor chip 106 and the output impedance of the external circuit connected to the input terminal 102. The characteristic of the mismatch loss of the impedance at the connection point F is used as an example of an index indicative of the high-frequency characteristics of the semiconductor device. The mismatch loss of the impedance can be calculated by $-10 \times \log(1-\Gamma^2)$, where $\Gamma$ is a reflection coefficient at the connection point F.

A graph of a broken line (circle mark) shown in FIG. 5 represents a change in the mismatch loss of the impedance at the connection point F relative to a change in the inductance of the first wires 109 electrically connecting the input terminal 120 and the matching circuit of the second internal matching circuit board 108. Specifically, the graph represents a change in the mismatch loss of the impedance at the connection point F when it is assumed that the inductance of the first wires 109 changes from the design value of 0.5 nH within a range of ±0.1 nH, i.e., that an effective inductance value changes within a range of 0.4 to 0.6 nH due to a substantially inevitable error (e.g., dimension tolerance of the components or positioning tolerance of the components) generated in manufacturing of the semiconductor device.

A graph of a dotted line (square mark) shown in FIG. 5 represents a change in the mismatch loss of the impedance at the connection point F relative to a change in the inductance of the second wires 110 electrically connecting the matching circuit of the second internal matching circuit board 108 and the matching circuit of the first internal matching circuit board 107. Specifically, the graph represents a change in the mismatch loss of the impedance at the connection point F when it is assumed that the inductance of the second wires 110 changes relative to the design value of 1.3 nH within a range of ±0.1 nH, i.e., that an effective inductance value changes within a range of 1.2 to 1.4 nH.

A graph of a solid line (triangle mark) shown in FIG. 5 represents a change in the mismatch loss of the impedance at the connection point F relative to a change in the inductance of the third wires 111 electrically connecting the matching circuit of the first internal matching circuit board 107 and the transistor chip 106. Specifically, the graph represents a change in the mismatch loss of the impedance at the connection point F when it is assumed that the inductance of the third wires 111 changes relative to the design value of 0.5 nH within a range of ±0.1 nH, i.e., that an effective inductance value changes within a range of 0.4 to 0.6 nH.

As shown in FIG. 5, when the inductance value of the wires changes, the third wires 111 have significantly larger effect on the mismatch loss of the impedance as compared to the other wires. Therefore, it can be understood that variation in the inductance of the third wires 111 significantly contributes to variation in the high-frequency characteristics of the semiconductor device as compared to the other wires.

The variation in the inductance of the third wires 111 is mainly generated by variation in the length of the third wires 111. The variation in the length of the third wires 111 is mainly caused by variation in relative positional relationship between the first internal matching circuit board 107 and the transistor chip 106 electrically connected through the third wires 111 to each other.

Therefore, in the semiconductor device of the first embodiment, as shown in FIG. 1, the first internal matching circuit board 107 and the transistor chip 106 are disposed in contact with each other on the base portion 101 so as to suppress the variation in relative positional relationship between the first internal matching circuit board 107 and the transistor chip 106.

Specifically, the transistor chip 106, the first internal matching circuit board 107, and the second internal matching circuit board 108 are joined via, for example, paste or solder, to the base portion 101, as described above. For example, molten paste is applied onto the base portion 101, and the transistor chip 106 and the first internal matching circuit board 107 are disposed in contact with each other on the applied paste. The paste is allowed to cure in this contact state, and the transistor chip 106 and the first internal matching circuit board 107 are disposed certainly in contact with each other inside the package of the semiconductor device.

Since the transistor chip 106 and the first internal matching circuit board 107 are disposed in contact with each other inside the package of the semiconductor device, the variation in relative positional relationship between the transistor chip 106 and the first internal matching circuit board 107 can significantly be suppressed as compared to when the transistor chip 106 and the first internal matching circuit board 107 are disposed at a distance from each other inside the package. In particular, even if variation occurs in respective positions of the transistor chip 106 and the first internal matching circuit board 107 relative to the base portion 101, the relative positional relationship is unchanged between the transistor chip 106 and the first internal matching circuit board 107. As a result, the variation can be suppressed in the length of the third wires 111 electrically connecting the transistor chip 106 and the matching circuit of the first internal matching circuit board 107. Consequently, this enables suppression of the variation in the high high-frequency characteristics of the semiconductor device generated due to the variation in the length of the third wires 111.

According to the first embodiment, the semiconductor device with the suppressed variation in the high-frequency characteristics can be provided without processing of the base portion 101, i.e., inexpensively.

Second Embodiment

Figure 6:
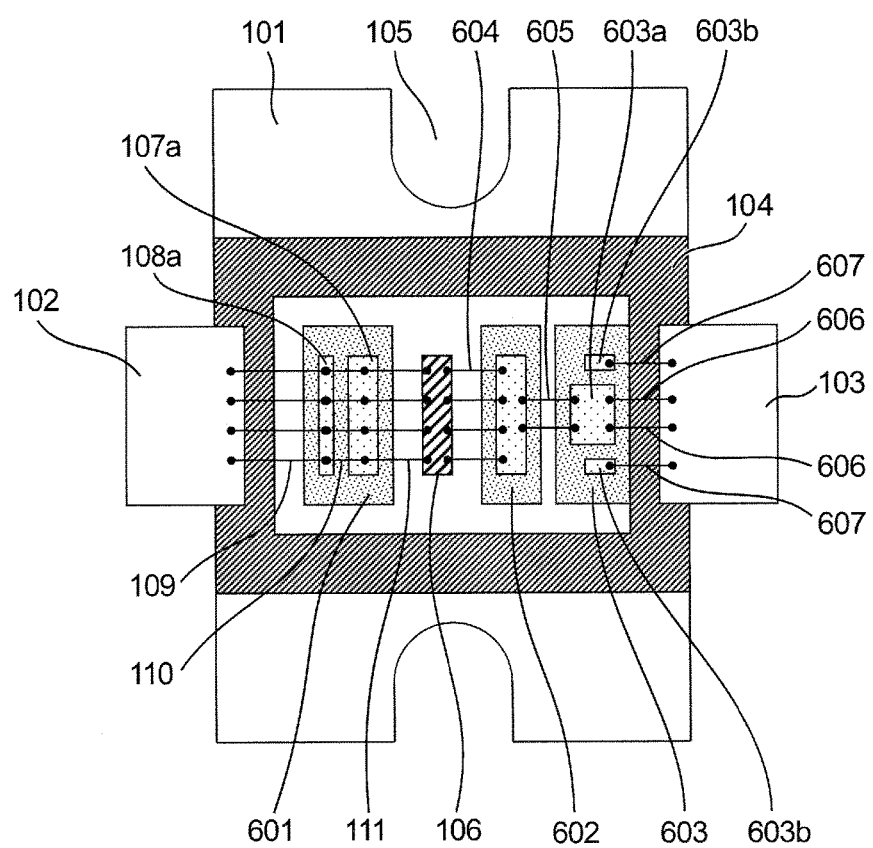
FIG. 6 is a top view of a semiconductor device of a second embodiment in this disclosure.

A semiconductor device of a second embodiment according to this disclosure will be described with reference to the accompanying drawings. FIG. 6 is a top view of the semiconductor device of the second embodiment according to this disclosure. In FIG. 6, the elements having substantially the same function and configuration as the first embodiment are denoted by the same numbers.

In the semiconductor device of the second embodiment, the elements in the base portion 101, the input terminal 102, the output terminal 103, the ceramic frame body 104, the transistor chip 106, the first wires 109, the second wires 110, and the third wires 111 are the same as the elements in the semiconductor device of the first embodiment in terms of the function and the configuration and therefore will not be described in the second embodiment.

The semiconductor device of the second embodiment has matching circuits 107a, 107b, which are the same as the matching circuits (conductor layer patterns) of the first and second internal matching circuit boards 107, 108 of the first embodiment, disposed on one board to make up a third matching circuit board 601. The third matching circuit board 601 is disposed on the input-side signal transmission path between the input terminal 102 and the transistor chip 106. The semiconductor device of the second embodiment has a fourth internal matching circuit board 602 and a fifth internal matching circuit board 603 disposed on an output-side signal transmission path between the transistor chip 106 and the output terminal 103. On the output-side signal transmission path between the transistor chip 106 and the output terminal 103, the fourth internal matching circuit board 602 is disposed closer to the transistor chip 106 while the fifth internal matching circuit board 603 is disposed closer to the output terminal 103.

In the semiconductor device of the second embodiment, the third, fourth, and fifth internal matching circuit boards 601, 602, 603 have the back surfaces thereof joined to the base portion 101 through conductive paste or solder, for example.

The fourth internal matching circuit board 602 is made up by forming a pattern of a conductor layer on a surface and a conductor layer on an entire back surface of a high permittivity ceramic board made of alumina or titanium oxide, for example.

The fifth internal matching circuit board 603 is made up by forming a pattern of a conductor layer on a surface and a conductor layer on an entire back surface of a high permittivity ceramic board. Specifically, a main path pattern 603a utilized as a microstrip line and island patterns 603b utilized as parallel capacitance are formed on the surface of the high permittivity ceramic board.

The conductor layer pattern on the surface of the fourth internal matching circuit board 602 is electrically connected to a drain terminal of the transistor chip 106 through a plurality of fifth wires 604 such as gold wires. The conductor layer pattern on the surface of the fourth internal matching circuit board 602 is electrically connected to the main path pattern 603a of the fifth internal matching circuit board 603 through a plurality of sixth wires 605. Therefore, the conductor layer pattern on the surface of the fourth internal matching circuit board 602 acts as a microstrip line.

The main path pattern 603a of the fifth internal matching circuit board 603 acts as a microstrip line is due to electric connection to the output terminal 103 through a plurality of seventh wires 606, and due to electric connection to the conductor layer pattern on the surface of the fourth internal matching circuit board 602 through the plurality of the sixth wires 605.

The island patterns 603b of the fifth internal matching circuit board 603 act as parallel capacitance due to electric connection to the output terminal 103 through a plurality of eighth wires 607, and due to parallel plate type capacitance generated between the conductor layer on the back surface of the fifth internal matching circuit board 603 and the island patterns 603b.

Figure 7:
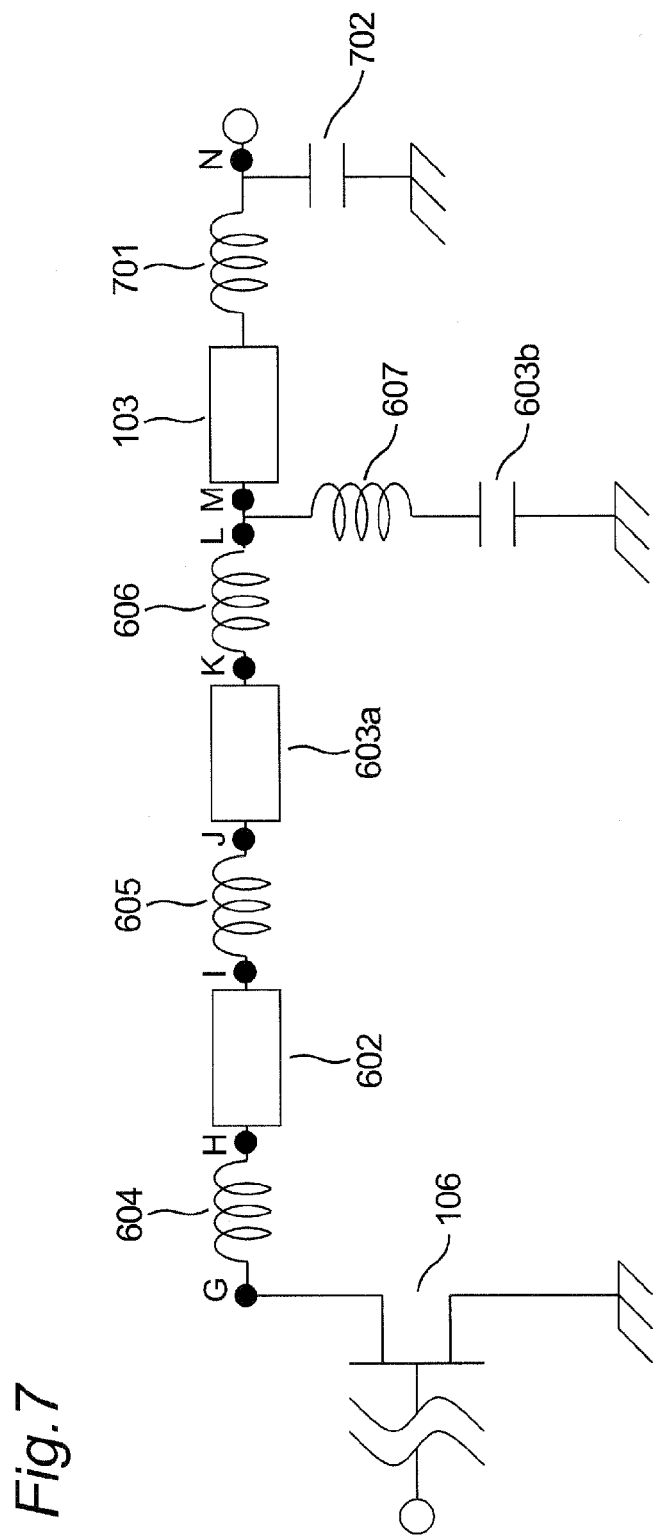
FIG. 7 is an equivalent circuit diagram of the semiconductor device of the second embodiment in this disclosure.

FIG. 7 shows an equivalent circuit of the semiconductor device of the second embodiment shown in FIG. 6. In FIG. 7, a circuit of the input-side signal transmission path from the input terminal 102 to the transistor chip 106 is the same as the equivalent circuit shown in FIG. 3 in the first embodiment and therefor is not shown.

The fifth to eighth wires 604 to 607 transmit high-frequency signals and can therefore be considered as inductance.

The conductor pattern on the surface of the fourth internal matching circuit board 602 acts as a microstrip line as described above.

The main path pattern 603a of the fifth internal matching circuit board 603 acts as a microstrip line as described above.

The island patterns 603b of the fifth internal matching circuit board 603 act as parallel capacitance as described above.

As shown in the equivalent circuit of FIG. 7, in the semiconductor device of the second embodiment, an external circuit electrically connected to the output terminal 103 has a serial inductor 701 having one end connected to the output terminal 103 and parallel capacitance 702 connected to the other end of the inductor 701. The semiconductor device of the second embodiment is configured to have impedance of 50 Ω when the transistor chip 106 is viewed from a connection point N between the inductor 701 and the capacitance 702.

Figure 8:
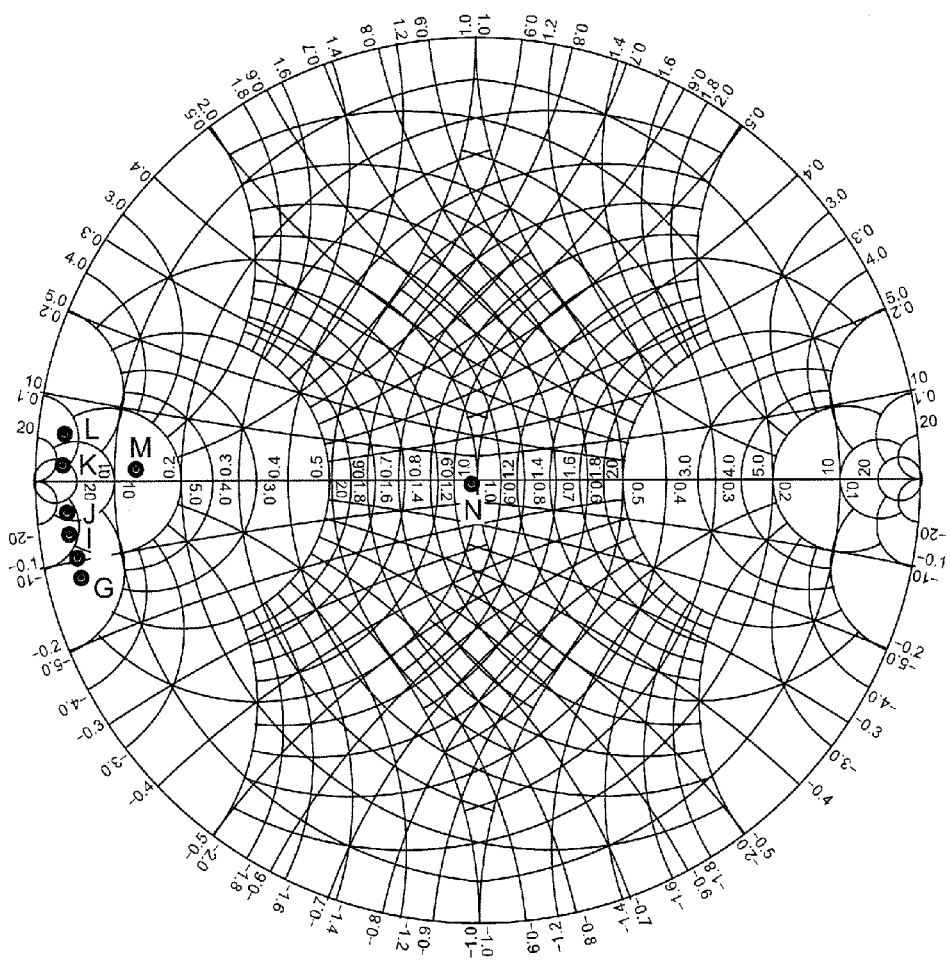
FIG. 8 is an explanatory diagram of output impedance of the semiconductor device of the second embodiment in this disclosure.

FIG. 8 shows impedance on a Smith chart when the transistor chip 106 is viewed at connection points G to N between the multiple components shown in the equivalent circuit of FIG. 7. By way of example, FIG. 8 shows the case of the transistor chip 106 having the output impedance of (2.000−j6.000)Ω and the signal frequency of 2 GHz. Therefore, a reactance component in the impedance of the transistor chip 106 is equal to or less than zero and is negative.

When the transistor chip 106 is viewed from the connection point G between the transistor chip 106 and the fifth wires 604, the impedance is the same as the output impedance of the transistor chip 106 and is therefore (2.000−j6.000)Ω indicated by a point G in FIG. 8.

By way of example, if the inductance value of the fifth wires 604 is 0.1 nH, when the transistor chip 106 is viewed from the connection point H between the fifth wires 604 and a matching circuit of the fourth internal matching circuit board 602, the impedance is (2.000−j4.743)Ω indicated by a point H of FIG. 8.

By way of example, if the microstrip line of the fourth internal matching circuit board 602 has characteristic impedance of 10Ω and a phase rotation amount of 8 degrees at 2 GHz, when the transistor chip 106 is viewed from the connection point I between the matching circuit of the fourth internal matching circuit board 602 and the sixth wires 605, the impedance is (1.791−j3.177)Ω indicated by a point I of FIG. 8.

By way of example, if the inductance value of the sixth wires 605 is 0.1 nH, when the transistor chip 106 is viewed from the connection point J between the sixth wires 605 and a matching circuit of the fifth internal matching circuit board 603, the impedance is (1.791−j1.920)Ω indicated by a point J of FIG. 8.

By way of example, if the microstrip line of the fifth internal matching circuit board 603a has characteristic impedance of 5Ω and a phase rotation amount of 35 degrees at 2 GHz, when the transistor chip 106 is viewed from the connection point K between the matching circuit of the fifth internal matching circuit board 603 and the seventh wires 606, the impedance is (1.596−j0.931)Ω indicated by a point K of FIG. 8.

By way of example, if the inductance value of the seventh wires 606 is 0.15 nH, when the transistor chip 106 is viewed from the connection point L between the seventh wires 606 and the output terminal 103, the impedance is (1.596+j2.816)Ω indicated by a point L of FIG. 8.

By way of example, if the inductance value of the eighth wires 607 (a total inductance value of the two eighth wires 607 shown in FIG. 6) is 0.15 nH and the effective capacitance value of the island patterns 603b is 13.5 pF, when the transistor chip 106 is viewed from the connection point M between the eighth wires 607 and the output terminal 103, the impedance is (6.459+j0.823)Ω indicated by a point M of FIG. 8.

By way of example, in the external circuit outside the package, if the inductance value of the serial inductance 701 is 1.25 nH and the capacitance value of the parallel capacitance 702 is 4.2 pF, when the transistor chip 106 is viewed from the connection point N between the inductance 701 and the capacitance 702, the impedance is (48.761+j0.710)Ω indicated by a point N of FIG. 8. As a result, when the transistor chip 106 is viewed from the connection point N, the impedance is a value substantially equal to 50Ω, which is the impedance of the external circuit.

The inductance values of the wires can be adjusted by changing the length of the wires, the number of the wires, and the distance between the wires.

The capacitance value of the island patterns 603b can be adjusted by the relative permittivity and the thickness of the high permittivity ceramic board of the fifth internal matching circuit board 603 and the area of the conductor layer pattern.

If the material and the thickness of the respective high-permittivity ceramic boards are the same between the fourth and fifth internal matching circuit boards 602, 603, the respective matching circuits (conductor layer patterns) may be formed on one high-permittivity ceramic board.

Figure 9:
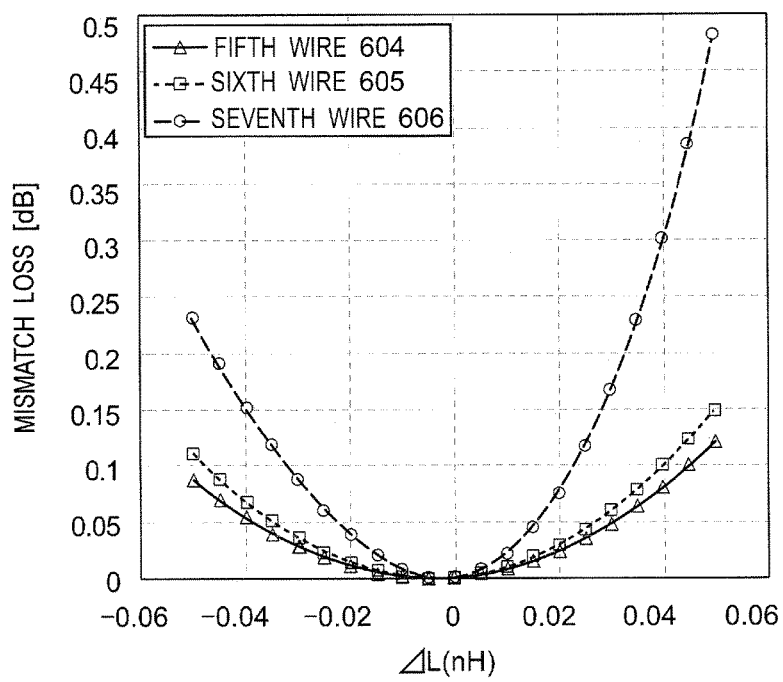
FIG. 9 is a diagram of relationship between change in inductance value of wires and mismatch loss of impedance of the second embodiment in this disclosure.

FIG. 9 shows a mismatch loss of the impedance at the connection point N when an inductance value of any one of the fifth wires 604, the sixth wires 605, and the seventh wires 606 changes relative to a design value. In FIG. 9, the horizontal axis indicates a change in the inductance value of the wires 604 to 606 and the vertical axis indicates a mismatch loss of the impedance at the connection point N. In the case shown in FIG. 9, the inductance value of the wires 604 to 606 changes relative to the design value within a range of ±0.05 nH.

A graph of a solid line (triangle mark) shown in FIG. 9 represents a change in the mismatch loss of the impedance at the connection point N relative to a change in the inductance of the fifth wires 604 electrically connecting the drain terminal of the transistor chip 106 and the matching circuit of the fourth internal matching circuit board 602. Specifically, the graph represents a change in the mismatch loss of the impedance at the connection point N when it is assumed that the inductance of the fifth wires 604 changes from the design value of 0.1 nH within ±0.05 nH, i.e., that an effective inductance value changes within a range of 0.05 to 0.15 nH due to a substantially inevitable error (e.g., dimension tolerance of each of the components or positioning tolerance of the components) generated in manufacturing of the semiconductor device.

A graph of a dotted line (square mark) shown in FIG. 9 represents a change in the mismatch loss of the impedance at the connection point N relative to a change in the inductance of the sixth wires 605 electrically connecting the fourth internal matching circuit board 602 and the fifth internal matching circuit board 603 (the main path pattern 603a). Specifically, the graph represents a change in the mismatch loss of the impedance at the connection point N when it is assumed that the inductance of the sixth wires 605 changes from the design value of 0.1 nH within ±0.05 nH, i.e., that an effective inductance value changes within a range of 0.05 to 0.15 nH.

A graph of a broken line (circle mark) shown in FIG. 9 represents a change in the mismatch loss of the impedance at the connection point N relative to a change in the inductance of the seventh wires 606 electrically connecting the fifth internal matching circuit board 603 (the main path pattern 603a) and the output terminal 103. Specifically, the graph represents a change in the mismatch loss of the impedance at the connection point N when it is assumed that the inductance of the seventh wires 606 changes from the design value of 0.15 nH within ±0.05 nH, i.e., that an effective inductance value changes within a range of 0.1 to 0.2 nH. As shown in FIG. 6, both the seventh wires 606 and the eighth wires 607 electrically connect the matching circuit of the fifth internal matching circuit board 603 and the output terminal 103. Therefore, if the positional relationship between the fifth internal matching circuit board 603 and the output terminal 103 changes, the length of the seventh wires 606 changes and the length of the eighth wires 607 also changes.

Therefore, the graph of the broken line (circle mark) shown in FIG. 9 represents a change in the mismatch loss of the impedance at the connection point N in the case of a change in the inductance of the seventh wires 606 as well as in the case of a change in the inductance of the eighth wires 607.

As shown in FIG. 9, it can be understood that when the inductance value of the wires changes, the seventh wires 606 have larger effect on the mismatch loss of the impedance as compared to the other wires. Therefore, variation in the inductance of the seventh wires 606 significantly contributes to variation in the high-frequency characteristics of the semiconductor device as compared to the other wires.

Therefore, in the case of the second embodiment, the fifth internal matching circuit board 603 and the output terminal 103 are disposed in contact with each other in the semiconductor device so as to suppress the variation in inductance, i.e., variation in wire length, of the seventh wires 606 having the largest effect on the high-frequency characteristics of the semiconductor device. Strictly speaking, as shown in FIG. 6, the fifth internal matching circuit board 603 is disposed on the base portion 101 to be in contact with a predetermined position of the ceramic frame body 104 retaining the output terminal 103. As a result, the variation in relative positional relationship can be suppressed between the fifth internal matching circuit board 603 and the output terminal 103 to suppress the variation in length of the seventh wires 606 providing the electrical connection therebetween. Consequently, this enables suppression of the variation in the high high-frequency characteristics of the semiconductor device generated due to the variation in the length of the seventh wires 606.

In the configuration of the semiconductor device of the second embodiment, as described with reference to FIGS. 7 and 8, the reactance component is converted into a positive state, i.e., inductive impedance, at the connection point K between the main path pattern 603a of the fifth internal matching circuit board 603 and the output terminal 103. Therefore, the components electrically connected by the seventh wires 606 immediately after the connection point K, i.e., the fifth internal matching circuit board 603 and the output terminal 103, are substantially brought into contact with each other and mounted on the base portion 105. In particular, in an internal matching circuit board converting impedance of a semiconductor element having a reactance component equal to or less than zero into inductive impedance in the semiconductor device of the second embodiment, the components electrically connected by the seventh wires 606 immediately after the conversion into the inductive impedance by the fifth internal matching circuit board 603 closest to the semiconductor device are disposed in direct or indirect contact with each other within the package.

In the configuration of the second embodiment, the input terminal 102 and the output terminal 103 are preliminarily joined to the ceramic frame body 104, and the positions of lead terminals of the input terminal 102 and the output terminal 103 are highly accurately decided in the ceramic frame body 104. Each of the ceramic frame body 104 and the fifth internal matching circuit board 603 is formed with accuracy higher than accuracy of mounting positions of components, and the respective contact surfaces thereof are formed such that a distance is always kept constant between each lead terminal of the output terminal 130 and a corresponding connection terminal of the fifth internal matching circuit board 603.

According to the configuration of the second embodiment, as is the case with the first embodiment, the semiconductor device with the variation in the high-frequency characteristics suppressed can be provided without processing of the base portion 101, i.e., inexpensively.

Although the present invention has been described in terms of two embodiments in this disclosure, the present invention is not limited to the configurations of these two embodiments and can variously be modified within the technical concept of the present invention.

Although the semiconductor devices of the first and second embodiments have been described in terms of the configuration including the transistor chip 106 as the semiconductor element, the present invention is not limited to such a configuration. Any semiconductor device is available as long as the semiconductor device executes a signal process, or particularly, a process of a high-frequency signal.

Although the semiconductor devices of the first and second embodiments have been described as a ceramic package type device having a ceramic frame body, the present invention may be applied to a resin sealing package type device.

In the semiconductor devices of the first and second embodiments, the index having an influence on the high-frequency characteristics of the semiconductor devices due to variation in wire length is a mismatch loss of impedance at the connection point F between the first wires 109 and the input terminal 102 (i.e., an end of the input terminal 102 closer to the transistor chip 106) as shown in FIG. 3 in the case of the first embodiment and is a mismatch loss of impedance at the connection point N between the inductor 701 and the capacitance 702 of the external circuit as shown in FIG. 7 in the case of the second embodiment. However, these are exemplification and are not limitations of the present invention. For example, the high-frequency characteristics of the semiconductor device may be characteristics of a mismatch loss of impedance at an input end of the input terminal 102 on the side opposite to the transistor chip 106, an input end of the output terminal 103 on the side of the transistor chip 106, or an output end of the output terminal 103 on the side opposite to the transistor chip 106.

Alternatively, for example, the index of the high-frequency characteristics of the semiconductor device may be a transmission loss of the signal transmission path between the input terminal 102 and the transistor chip 106 or between the transistor chip 106 and the output terminal 103, i.e., a transmission loss in the wires and the internal matching circuit boards on the signal transmission path. The index of the high-frequency characteristics of the semiconductor device may be a power gain from the input terminal 102 to the output terminal 103 or may be the input/output impedance itself of the semiconductor device. In other words, the index of the high-frequency characteristics of the semiconductor device may be any characteristics expressed by a physical amount having an influence on performance of a semiconductor device handling a high-frequency signal.

As described above, in the case of the first embodiment, the two internal matching circuit boards 107, 108 are disposed on the input-side signal transmission path between the input terminal 102 and the transistor chip 106. In the case of the second embodiment, the one third internal matching circuit board 601 is disposed on the input-side signal transmission path between the input terminal 102 and the transistor chip 106 while the fourth and fifth internal matching circuit boards 602, 603 are disposed on the output-side signal transmission path between the transistor chip 106 and the output terminal 103. In the semiconductor device of the present invention, the arrangement of the internal matching circuit boards is not limited to these arrangements of the first and second embodiments. In particular, to match the output impedance of the external circuit electrically connected to the input terminal 102 and the input impedance of the transistor chip 106 and, alternatively or additionally, to match the input impedance of the external circuit electrically connected to the output terminal 103 and the output impedance of the transistor chip 106, at least one internal matching circuit board may be disposed on at least one of the signal transmission paths between the input terminal 102 and the transistor chip 106 and between the transistor chip 106 and the output terminal 103.

Additionally, for example, in the case of the first embodiment, the wires causing the largest change in the high-frequency characteristics of the semiconductor device due to a change in wire length are the third wires 111 electrically connecting the transistor chip 106 and the first internal matching circuit board 107; however, it is obvious that the wires causing the largest change in the high-frequency characteristics may be different from the third wires 111 because of a difference in the configurations of the transistor chip 106 and the first and second internal matching circuit boards 107, 108, and the materials and the numbers of the first to fourth wires 109 to 112. For example, in the case of the first embodiment, if the configurations of the transistor chip 106 and the first and second internal matching circuit boards 107, 108 are different, the first wires 109 electrically connecting the input terminal 102 and the matching circuit of the second internal matching circuit board 108 may be the wires causing the largest change in the high-frequency characteristics of the semiconductor device due to a change in wire length. Therefore, it should be noted that, in a plurality of wires electrically connecting a plurality of components in the semiconductor device, the wires causing the largest change in the high-frequency characteristics of the semiconductor device due to a change in wire length differ depending on a configuration of a component of the semiconductor device.

Additionally, in the case of the first and second embodiments, the components electrically connected by the wires causing the largest change in the high-frequency characteristics of the semiconductor device due to a change in wire length are disposed in direct or indirect contact with each other inside the package of the semiconductor device. In the case of the first embodiment, as shown in FIG. 1, the first internal matching circuit board 107 and the transistor chip 106 electrically connected by the third wires 111 are disposed in direct contact with each other within the package. In the case of the second embodiment, as shown in FIG. 6, the fifth internal matching circuit board 603 and the output terminal 103 electrically connected by the seventh wires 606 are disposed in indirect contact through the ceramic frame body 104 with each other within the package. Therefore, in the examples described in the case of the first and second embodiments, a set of the components are disposed in a contact state. However, the configuration of the semiconductor device of the present invention is not limited to disposing one set of the components in a contact state.

Figure 10:
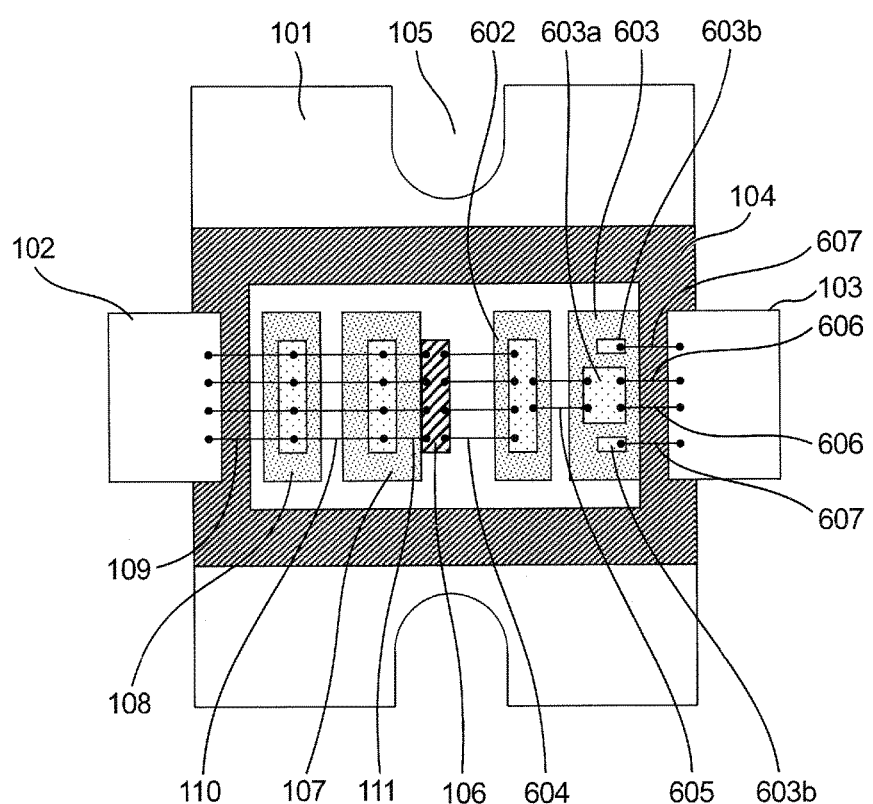
FIG. 10 is a top view of a semiconductor device of another embodiment in this disclosure.

FIG. 10 shows a semiconductor device having a configuration having two sets of components brought into contact with each other as an exemplification. In the semiconductor device shown in FIG. 10, the first and second internal matching circuit boards 107, 108 are disposed on the input-side signal transmission path between the input terminal 102 and the transistor chip (semiconductor element) 106 as is the case with the first embodiment shown in FIG. 1, and the fourth and fifth internal matching circuit boards 602, 603 are disposed on the output-side signal transmission path between the transistor chip (semiconductor element) 106 and the output terminal 103 as is the case with the second embodiment shown in FIG. 6.

As shown in FIG. 10, the first internal matching circuit board 107 and the transistor chip 106 are in direct contact on the input-side signal transmission path between the input terminal 102 and the transistor chip (semiconductor element) 106. The fifth internal matching circuit board 603 and the output terminal 103 are in indirect contact through the ceramic frame body 104 on the output-side signal transmission path between the transistor chip (semiconductor element) 106 and the output terminal 103.

Although the components of the semiconductor element and the internal matching circuit board are in direct contact with each other in a configuration example of the input-side signal transmission path shown in FIG. 10, the components may be in indirect contact with each other through another member (e.g., a spacer) as long as positions and postures between the components are uniquely determined. Conversely, although the internal matching circuit board and the output terminal are in indirect contact through an intermediate member (the ceramic frame body 104) with each other in a configuration example of the output-side signal transmission path shown in FIG. 10, the output terminal 103 and the ceramic frame body 104 acting as the intermediate member are integrally configured in this example so that the positions and postures of the output terminal and the internal matching circuit board are uniquely determined and, therefore, the output terminal and the internal matching circuit board are substantially in the same state as the direct contact state.

In the configuration of the first embodiment, the third wires 111 electrically connecting the transistor chip 106 and the matching circuit of the first internal matching circuit board 107 cause the largest change in the characteristic used as the index in the high-frequency characteristics of the semiconductor device. In the configuration of the second embodiment, the seventh wires 606 electrically connecting the matching circuit of the fifth internal matching circuit board 603 and the output terminal 103 cause the largest change in the characteristic used as the index in the high-frequency characteristics of the semiconductor device. In the description of the first and second embodiments, only the third wires 111 and the seventh wires 606 cause a change exceeding an allowable value in the characteristic used as the index in the high-frequency characteristics. However, in some configurations of the semiconductor device, a plurality of the wires may include a plurality of wires causing a change exceeding the allowable value of the characteristic used as the index in the high-frequency characteristics of the semiconductor device due to a change in wire length. For example, allowable values may be exceeded by both a maximum value of a mismatch loss of impedance generated by variation in wire length of one wire and a maximum value of a mismatch loss of impedance generated by variation in wire length of another wire. In such a case, the components electrically connected by the one wire may be disposed in contact with each other in the package of the semiconductor device, and the components electrically connected by the other wire may also be disposed in contact with each other. In other words, in the configuration of the semiconductor device of this disclosure, a plurality of sets of components may be disposed in contact arrangement.

If a plurality of wires exceeds the allowable value of the characteristic used as the index in the high-frequency characteristics of the semiconductor device due to a change in wire length, the components electrically connected by at least the wire closest to the semiconductor element may be disposed in direct or indirect contact with each other inside the package such that the length between connection terminals is made constant.

Even if a plurality of the wires includes a wire causing a largest change in the characteristic used as the index of the high-frequency characteristics of the semiconductor device due to a change in wire length, a change amount of the characteristic used as the index of the high-frequency characteristics changed due to the wire may be an extremely small value equal to or less than the allowable value. The components electrically connected by such a wire may not necessarily be disposed in direct or indirect contact with each other.

In a broad sense, in the semiconductor device of the embodiments of this disclosure, if a plurality of the wires includes at least one wire causing a change exceeding the allowable value (a value at which impedance matching can be achieved between an external circuit and the semiconductor device) in the high-frequency characteristics of the semiconductor device as a result of a change in wire length within a range generated by a substantially inevitable error (e.g., dimension tolerance of the components and positioning tolerance of the components) in manufacturing of the semiconductor device, the component electrically connected by the wire are disposed in direct or indirect contact with each other in the package of the semiconductor device.

In this regard, it is conceivable that all the multiple components electrically connected by a plurality of the wires are disposed in direct contact with each other inside the package of the semiconductor device. For example, in the case of the semiconductor device of the first embodiment shown in FIG. 1, it is conceivable that the gaps are eliminated between the input terminal 102 (the ceramic frame body 104) and the second internal matching circuit board 108, between the second internal matching circuit board 108 and the first internal matching circuit board 107, between the first internal matching circuit board 107 and the transistor chip 106, and between the transistor chip 106 and the output terminal 103 (the ceramic frame body 104), so as to bring all these components into direct contact with each other. In other words, it is conceivable that a semiconductor device is configured to have the internal matching circuit boards on the input side and/or the output side and the semiconductor element mounted without a gap in the internal space of the ceramic frame body 104.

However, if all the components on the signal transmission path from the input terminal to the output terminal are designed such that adjacent components are mounted in contact with each other without a gap on the base portion, the component mounted on the base portion at the end of a mounting step may not be mounted because a mounting space in the internal space of the ceramic frame body becomes narrower due to variation in respective dimensions of the components mounted earlier.

Considering the mounting space becoming narrower as described above, for example, when components are electrically connected by at least one wire other than the wire causing a change exceeding the allowable value in the high-frequency characteristics of the semiconductor device due to a change in wire length, the components preferably have a gap and are disposed at a distance from each other inside the package. Particularly, when components are electrically connected by a wire corresponding to the smallest amount of change in the high-frequency characteristics of the semiconductor device due to a change in wire length, the components are preferably disposed at a distance from each other inside the package.

As in the description of the configurations of the first and second embodiments, when components are electrically connected by a wire causing a change exceeding the allowable value in the high-frequency characteristics of the semiconductor device due to a change in wire length, the components are preferably brought into direct or indirect contact with each other. In the case of the semiconductor device of the first embodiment, as shown in FIG. 1, the transistor chip 106 and the first internal matching circuit board 107 are in direct contact. In the case of the semiconductor device of the second embodiment, as shown in FIG. 6, the fifth internal matching circuit board 603 and the output terminal 103 are in indirect contact through the ceramic frame body 104. In the second embodiment, the output terminal 103 and the ceramic frame body 104 are integrally configured, and the fifth internal matching circuit board 603 and the output terminal 103 are in substantially direct contact.

Therefore, to one of two components connected by a wire causing a change exceeding the allowable value of the characteristic used as the index of the high-frequency characteristics of the semiconductor device due to a change in wire length, the position and posture of the other component only need to be uniquely determined. Therefore, for example, in the case of the first embodiment shown in FIG. 1, with regard to the transistor chip 106 and the first internal matching circuit board 107, the components connected by the wire may be brought into indirect contact with each other through another member (e.g., a spacer) as long as the position and posture of the other component (the first internal matching circuit board 107) are uniquely determined relative to one component (transistor chip 106).

Moreover, in the case of the first and second embodiments, as shown in FIGS. 1 and 6, a plurality of the components of the semiconductor device is linearly arranged in the described example; however, the present invention is not limited to such a configuration. In particular, any configurations are available as long as the semiconductor element (e.g., the transistor chip 106) is disposed on the signal transmission path between the input terminal 102 and the output terminal 103 while an internal matching circuit board is disposed at least between the input terminal 102 and the semiconductor element or between the semiconductor element and the output terminal 103.

Additionally, in the case of the first and second embodiments, when components are electrically connected by a wire causing a change exceeding the allowable value of the characteristic used as the index of the high-frequency characteristics of the semiconductor device due to a change in wire length, the contact state between the components is maintained by joining each of the components to the base portion 101 through paste or solder etc.; however, the present invention is not limited to such a configuration. The semiconductor device of this disclosure may be configured such that, for example, the contact state between the components is maintained by engagement with each other.

As in the first and second embodiments, for example, as is the case of the transistor chip 106 and the first internal matching circuit board 107 of the first embodiment, if the components, i.e., the transistor chip 106 and the first internal matching circuit board 107, are disposed in contact with each other on molten paste (or solder) applied onto the base portion of the package and the paste is subsequently allowed to cure, the positions of the components may be displaced before curing of the paste and a gap may be generated between the components. However, the displacements of the components before curing of the paste can be controlled to a small constant amount by adjusting an amount of the paste. In particular, the gap generated between the components can be controlled to, for example, about several tens of μm, so as to put the components into a substantially contact state.

Although the embodiments are described in detail to a certain extent in this disclosure, the contents of the disclosure of the embodiments may naturally vary in terms of details of configuration, and the combination and order of the elements in the embodiments may be changed without departing from the scope and the spirit of the present invention.

INDUSTRIAL APPLICABILITY

The semiconductor device of this disclosure is applicable to a base station for mobile communication handling high-frequency signals at high power or various electronic devices including microwave home electronics such as microwave ovens.

REFERENCE SIGNS LIST

101 Base portion
102 Input terminal
103 Output terminal
104 Ceramic frame body
105 Cutout
106 Transistor chip (Semiconductor element)
107 First internal matching circuit board
108 Second internal matching circuit board
109 First wires
110 Second wires
111 Third wires
112 Fourth wires
601 Third internal matching circuit board
602 Fourth internal matching circuit board
603 Fifth internal matching circuit board
604 Fifth wires
605 Sixth wires
606 Seventh wires
607 Eighth wires
701 Serial inductor of External circuit
702 Parallel capacitance of External circuit

What is claimed is:

1. A semiconductor device having a package comprising:
as components disposed inside the package,
an input terminal and an output terminal for exchanging signals with an external circuit outside the package;
a semiconductor element disposed on a signal transmission path between the input terminal and the output terminal to execute a signal process;
an internal matching circuit board disposed on at least one signal transmission path of an input-side signal transmission path between the input terminal and the semiconductor element and an output-side signal transmission path between the semiconductor element and the output terminal for matching at least between output impedance of an external circuit connected to the input terminal and input impedance of the semiconductor device or between input impedance of an external circuit connected to the output terminal and output impedance of the semiconductor device; and a plurality of wires electrically connecting components to transmit signals, wherein the internal matching circuit board includes an input-side internal matching circuit board disposed on the input-side signal transmission path between the input terminal and the semiconductor element for matching impedance on the input side, and an output-side internal matching circuit board disposed on the output-side signal transmission path between the semiconductor element and the output terminal for matching impedance on the output side, the semiconductor element and the input-side internal matching circuit board are disposed in direct or indirect contact inside the package, and the output-side internal matching circuit board and the output terminal are disposed in direct or indirect contact inside the package, wherein the semiconductor device is configured that impedance of the semiconductor element having a reactance component indicating a negative state equal to or less than zero is converted by inductance of the wires and a matching circuit of the internal matching circuit board and matched with the output impedance of the external circuit connected to the input terminal or the input impedance of the external circuit connected to the output terminal, and out of the wires converting impedance of the semiconductor element having a reactance component indicating a negative state equal to or less than zero into inductive impedance indicating a positive state, components electrically connected by the wire closest to the semiconductor element are disposed in direct or indirect contact with each other inside the package.

2. A semiconductor device having a package comprising:

as components disposed inside the package, an input terminal and an output terminal for exchanging signals with an external circuit outside the package;

a semiconductor element disposed on a signal transmission path between the input terminal and the output terminal to execute a signal process;

an internal matching circuit board disposed on at least one signal transmission path of an input-side signal transmission path between the input terminal and the semiconductor element and an output-side signal transmission path between the semiconductor element and the output terminal for matching at least between output impedance of an external circuit connected to the input terminal and input impedance of the semiconductor device or between input impedance of an external circuit connected to the output terminal and output impedance of the semiconductor device; and a plurality of wires electrically connecting components to transmit signals, wherein the internal matching circuit board includes an input-side internal matching circuit board disposed on the input-side signal transmission path between the input terminal and the semiconductor element for matching impedance on the input side, and an output-side internal matching circuit board disposed on the output-side signal transmission path between the semiconductor element and the output terminal for matching impedance on the output side, the semiconductor element and the input-side internal matching circuit board are disposed in direct or indirect contact inside the package, and the output-side internal matching circuit board and the output terminal are disposed in direct or indirect contact inside the package, wherein the semiconductor device is configured that impedance of the semiconductor element having a reactance component indicating a negative state equal to or less than zero is converted by inductance of the wires and matching circuits of the internal matching circuit boards and matched with the output impedance of the external circuit connected to the input terminal or the input impedance of the external circuit connected to the output terminal, and out of the internal matching circuit boards converting impedance of the semiconductor element having a reactance component indicating a negative state equal to or less than zero into inductive impedance indicating a positive state, components electrically connected by a wire immediately after conversion into the inductive impedance by the internal matching circuit board closest to the semiconductor element are disposed in direct or indirect contact with each other inside the package.

* * * * *